United States Patent [19]
Kobayashi

[11] Patent Number: 5,693,505
[45] Date of Patent: Dec. 2, 1997

[54] METHOD OF FABRICATING A SEMICONDUCTOR DEVICE

[75] Inventor: Migaku Kobayashi, Tokyo, Japan

[73] Assignee: NEC Corporation, Tokyo, Japan

[21] Appl. No.: 355,905

[22] Filed: Dec. 14, 1994

[30] Foreign Application Priority Data

Dec. 24, 1993 [JP] Japan ............... 5-347354

[51] Int. Cl.⁶ ............................................. H01L 21/266
[52] U.S. Cl. .......................... 437/154; 437/29; 437/57
[58] Field of Search .................... 437/69, 20, 26, 437/27, 28, 30, 34, 147, 150, 154, 45, 56, 57, 29, 979; 148/DIG. 106, DIG. 163

[56] References Cited

U.S. PATENT DOCUMENTS

| | | | |
|---|---|---|---|
| 4,717,684 | 1/1988 | Katto et al. | 437/40 |
| 4,753,898 | 6/1988 | Parrillo et al. | 437/57 |
| 4,908,327 | 3/1990 | Chapman | 437/29 |
| 4,997,782 | 3/1991 | Bergonzoni | 437/57 |
| 5,091,324 | 2/1992 | Hsu et al. | 437/57 |
| 5,238,864 | 8/1993 | Maegawa et al. | 437/53 |
| 5,254,487 | 10/1993 | Tamagawa | 437/152 |
| 5,278,078 | 1/1994 | Kanebako et al. | 437/29 |
| 5,290,717 | 3/1994 | Shimazu | 437/57 |
| 5,342,802 | 8/1994 | Kubokoya et al. | 437/57 |
| 5,396,096 | 3/1995 | Akamatsu et al. | 437/56 |
| 5,403,764 | 4/1995 | Yamamoto et al. | 437/45 |
| 5,407,849 | 4/1995 | Khambaty et al. | 437/57 |
| 5,432,114 | 7/1995 | O | 437/56 |
| 5,439,835 | 8/1995 | Gonzalez | 437/27 |
| 5,460,984 | 10/1995 | Yoshida | 437/27 |
| 5,478,761 | 12/1995 | Komori et al. | 437/34 |
| 5,498,553 | 3/1996 | Yang | 437/57 |
| 5,501,993 | 3/1996 | Borland | 437/34 |
| 5,534,448 | 7/1996 | Baldi | 437/34 |

*Primary Examiner*—Jey Tsai
*Assistant Examiner*—S. Mulpuri
*Attorney, Agent, or Firm*—Sughrue, Mion, Zinn, Macpeak & Seas, PLLC

[57] ABSTRACT

The invention provides a method of fabricating a semiconductor device, including the steps of forming a plurality of active regions on a semiconductor substrate, covering a first active region with mask layers including a first mask layer and a second mask layer deposited on the first mask layer, implanting first electrically conductive type impurities into a second active region with the mask layers acting as a mask, removing the second mask layer, and implanting second electrically conductive type impurities into the first and second active regions. The method makes it possible to form a retrograde-distributed tripe well with less number of masks and less number of ion implantation than conventional methods.

8 Claims, 6 Drawing Sheets

FIG. IA PRIOR ART
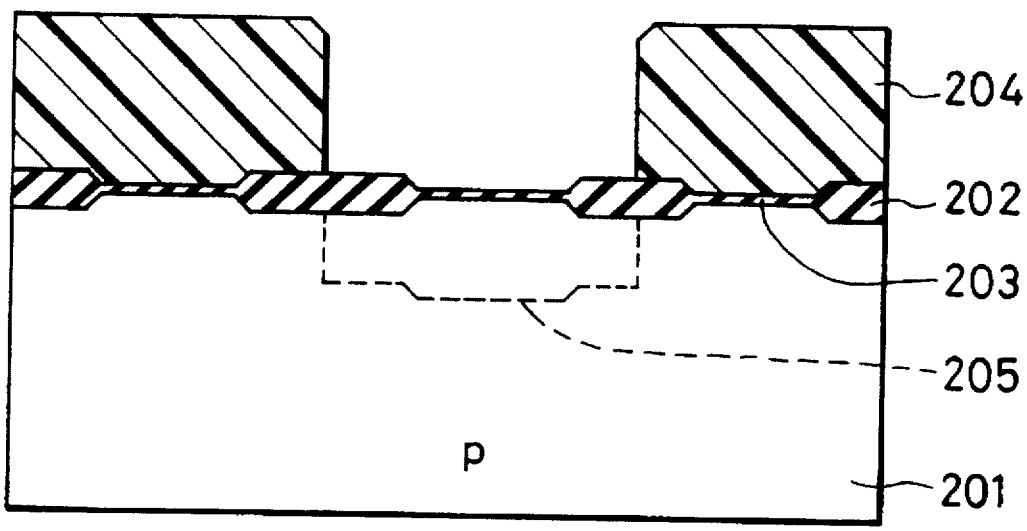
FIG. IB PRIOR ART
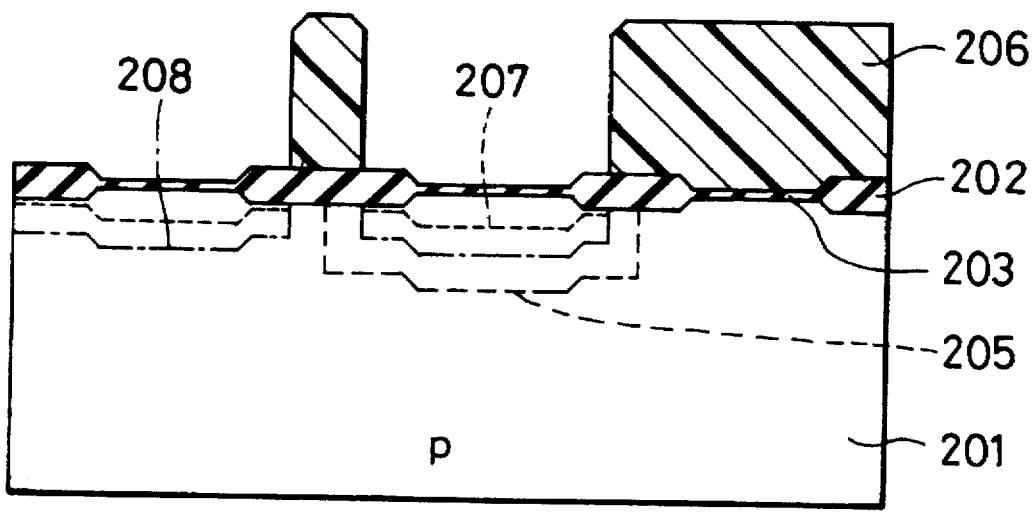

METHOD OF FABRICATING A SEMICONDUCTOR DEVICE

BACKGROUND OF THE INVENTION

1. Field of the Invention

The invention relates to a method of fabricating a semiconductor device, and more particularly to a method of fabricating a semiconductor device having a retrograde-distributed triple well structure.

2. Description of the Prior Art

In a CMOS type semiconductor device, one of transistors is formed in either a p-well layer or a n-well layer. On the other hand, a semiconductor device having a single well structure has a problem that the impurity concentration in a well layer tends to be too high with the result that an operating speed is reduced. Thus, in a semiconductor device which is required to act at a high speed, the device is fabricated to have a twin well structure wherein p and n well layers are formed in a substrate having a low concentration of impurities, to thereby optimize impurity concentrations of p and n well layers.

As is known to those skilled in the art, in a CMOS type semiconductor device takes place a latch up phenomenon in which parasitic thyristor derived from the structure of the CMOS type semiconductor device turns on. An excessive amount of current is generated in the semiconductor due to the latch up phenomenon, resulting in that characteristics of the semiconductor is deteriorated and/or that the semiconductor is damaged. In order to increase the resistance against the latch up phenomenon, there is often used a retrograded well structure having a well layer a deep portion of which has a higher impurity concentration than other portions.

In addition, in a semiconductor device such as DRAM, a substrate voltage of a memory cell is often controlled independently of a voltage of a semiconductor substrate so as to enhance a resistance against soft errors. In such a semiconductor device, a p-well in which a memory cell is to be formed is formed in an buried n-well layer, and thus the semiconductor device has a triple well structure.

Hereinbelow will be explained a conventional method of fabricating such a semiconductor device with reference to FIGS. 1A, 1B, 2A and 2B. FIGS. 1A to 2B are cross-sectional views showing the steps of a conventional method of fabricating a semiconductor having a retrograde-distributed triple well structure.

With reference to FIG. 1A, first, on one of main surfaces of a p-type silicon substrate 201 is formed field oxide layers 202 having a thickness of 400 nm, by means of the LOCOS process. Then, in a region where the field oxide layers 202 are not formed are formed silicon oxide layers 203 having a thickness of 50 nm, by means of the thermal oxidation process. Then, there are formed photoresist layers 204 having openings on a region on which buried n-well layers are to be formed. Then, buried ion implantation layers 205 are formed by implanting phosphorus by the number of $1 \times 10^{13}$ per square centimeter at an energy of, for instance, 2 MeV with the photoresist layers 204 acting as a mask.

Referring to FIG. 1B, after the photoresist layers 204 have been removed, there are formed photoresist layers 206 having openings on a region where p-well layers are to be formed, by means of photolithography technique. Then, first ion implantation layers 207 are formed by implanting boron by the number of $4 \times 10^{12}$ per square centimeter at an energy of 140 KeV with the photoresist layers 206 acting as a mask, and subsequently there are formed second ion implantation layers 208 by implanting boron by the number of $2 \times 10^{13}$ per square centimeter at an energy of 400 KeV. The first ion implantation layers 207 act as a channel stopping layer present under the field oxide layers in the p-well regions, and the second ion implantation layers 208 act to form a main body of the p-well layers.

Referring to FIG. 2A, after the photoresist layers 206 have been removed, there are formed photoresist layers 209 lying over a region where the p-well layers are to be formed, by means of photolithography technique. Then, third ion implantation layers 210 are formed by implanting phosphorus by the number of $4 \times 10^{12}$ per square centimeter at an energy of 400 KeV with the photoresist layers 209 acting as a mask, and subsequently there are formed fourth ion implantation layers 211 by implanting phosphorus by the number of $2 \times 10^{13}$ per square centimeter at an energy of 1 MeV. The third ion implantation layers 210 act as a channel stopping layer present under the field oxide layers in the n-well regions, and the fourth ion implantation layers 211 act to form a main body of the n-well layers.

Referring to FIG. 2B, after the photoresist layers 209 have been removed, impurities implanted into the buried ion implantation layers 205, the first ion implantation layers 207, the second ion implantation layers 208, the third ion implantation layers 210 and the fourth ion implantation layers 211 are activated by thermal treatment carried out, for instance, at 1000 degrees centigrade for 30 minutes. Thus, there are formed retrograded p-well layers 212, n-well layers 213 and buried n-well layers 214.

In the above mentioned conventional method of forming retrograde-distributed triple well, there are required three masks for photolithography: one for forming the buried n-well layers 214, one for forming the p-well layers 211 and one for forming n-well layers 213. In addition, the method requires five ion-implantations: one for forming the buried ion implantation layers 205, one for forming the first ion implantation layers 207, one for forming the second ion implantation layers 208, one for forming the third ion implantation layers 210 and one for forming the fourth ion implantation layers 211. Thus, the conventional method poses a problem that the large number of masks are necessary for forming a triple well structure, and hence the steps for fabricating a semiconductor device have to be complicated.

SUMMARY OF THE INVENTION

In view of the above mentioned problem of the prior method, it is an object of the present invention to provide a method of fabricating a semiconductor device in which less number of masks and less number of ion-implantations than a conventional method are required for forming a retrograde-distributed triple well structure.

The invention provides a method of fabricating a semiconductor device, including the steps of: forming a plurality of active regions on a semiconductor substrate; covering a first active region with mask layers including a first mask layer and a second mask layer deposited on the first mask layer; implanting first electrically conductive type impurities into a second active region with the mask layers acting as a mask; removing the second mask layer; and implanting second electrically conductive type impurities into the first and second active regions.

The invention also provides a method of fabricating a semiconductor device, including the steps of: forming a plurality of active regions on a semiconductor substrate; covering a first active region with mask layers including a first mask layer and a second mask layer deposited on the first mask layer; implanting first electrically conductive type impurities into second and third active regions with the mask layers acting as a mask; removing the second mask layer; covering the third active regions with a third mask layer; and implanting second electrically conductive type impurities into the first and second active regions.

In a preferred embodiment, the semiconductor substrate is of a first electrically conductive type.

In another preferred embodiment, the first mask layer is composed of poly silicon and the second mask layer is composed of photoresist.

In still another preferred embodiment, the step of implanting first electrically conductive type impurities and/or the step of implanting second electrically conductive type impurities are(is) achieved by a plurality of ion-implantations having different ranges.

In yet another preferred embodiment, the method further includes the step of ion-implanting for adjusting a threshold voltage of a MOS type transistor. This step is to be carried out just before the step of covering the first active region with the mask layers.

In still yet another preferred embodiment, the method further includes the step of ion-implanting for adjusting a threshold voltage of a MOS transistor. This step is to be carried out just before the step of implanting first electrically conductive type impurities into the second active region with the mask layers acting as a mask.

In further preferred embodiment, the method further includes the step of ion-implanting for adjusting a threshold voltage of a MOS transistor. This step is to be carried out just before the step of implanting second electrically conductive type impurities into the first and second active regions.

In further preferred embodiment, the method further includes the step of covering a region located between the second and third active regions with the same mask layers as the mask layers with which the first active region is covered.

In further preferred embodiment, the step of covering a region located between the second and third active regions with the same mask layers as the mask layers with which the first active region is covered, is concurrently carried out with the step of covering the first active region with the mask layers.

In further preferred embodiment, the plurality of active regions are formed by oxidizing the semiconductor substrate at selected regions.

As having been described, in the method in accordance with the invention, one of main surfaces of a semiconductor substrate is oxidized at selected regions to thereby define active regions and non-active regions. Then, stacked mask layers comprising a first mask layer and a second mask layer deposited on the first mask layer is formed on the semiconductor substrate in a desired pattern. Then, first electrically conductive type impurities are selectively ion-implanted. After the second mask layer has been removed, second electrically conductive type impurities are ion-implanted with at least a part of the first mask layer remaining present on the semiconductor substrate.

In accordance with the invention, there are provided advantages that a retrograde-distributed triple well structure can be formed with less number of masks and less number of ion implantations than conventional methods.

The above and other objects and advantageous features of the present invention will be made apparent from the following description made with reference to the accompanying drawings, in which like reference characters designate the same or similar parts throughout the drawings.

BRIEF DESCRIPTION OF THE DRAWINGS

FIGS. 1A, 1B, 2A and 2B are cross-sectional views showing the steps of a conventional method of fabricating a semiconductor device having a retrograde-distributed triple well structure.

DESCRIPTION OF THE PREFERRED EMBODIMENTS

Preferred embodiments in accordance with the present invention will be explained hereinbelow with reference to drawings.

[Embodiment 1]

Figure 2A:
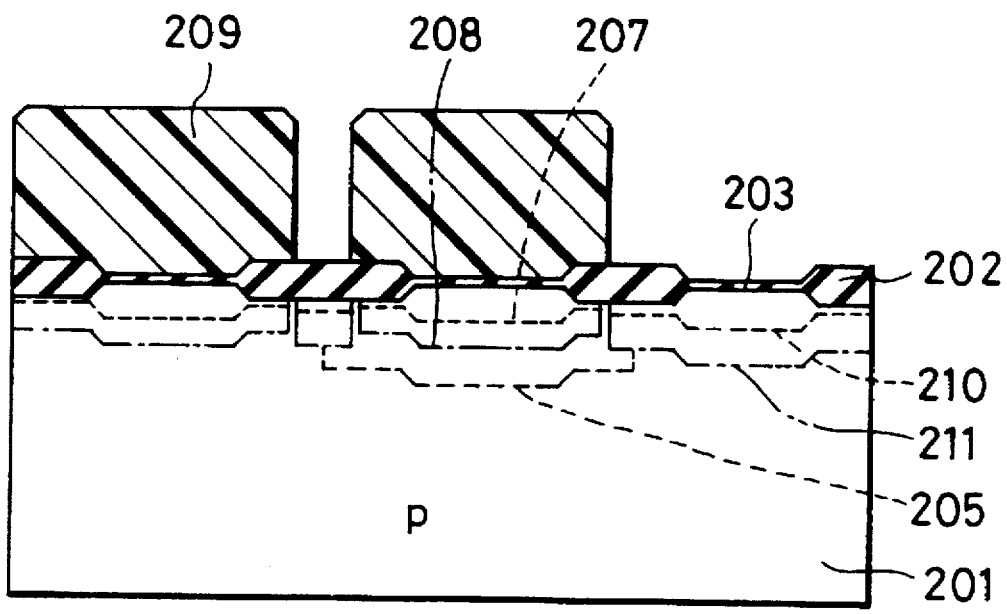
Figure 2B:
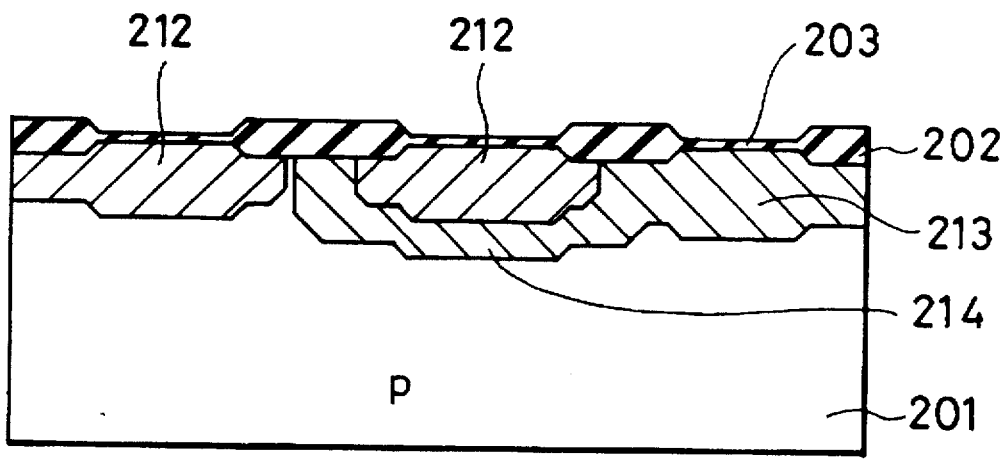
Figure 3A:
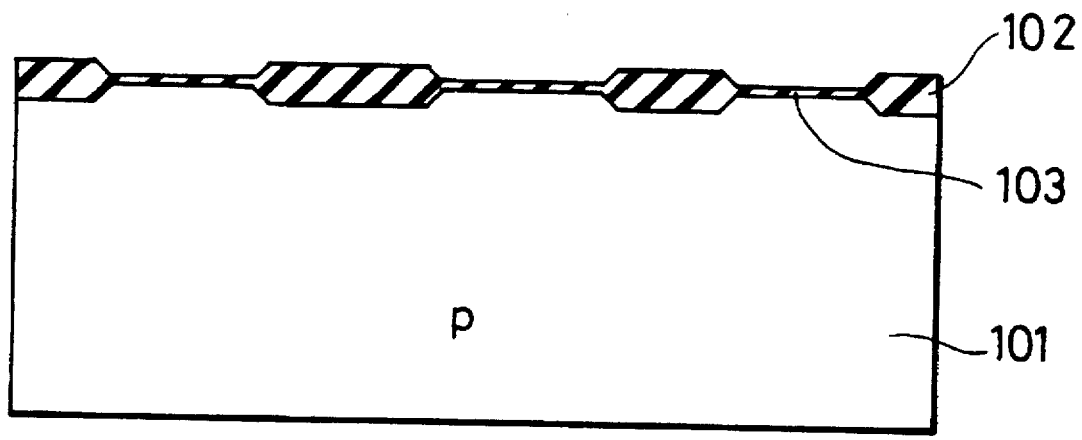
FIGS. 3A, 3B, 4A and 4B are cross-sectional views showing the steps of a method in accordance with a first embodiment of the present invention.

Referring to FIG. 3A, first, there is formed field oxide layers 102 having a thickness of 400 nm by means of LOCOS process on one of main surfaces of a p-type silicon substrate 101. There is also formed silicon dioxide layers 103 having a thickness of 50 nm by means of thermal oxidation process on a region in which the field oxide layers 102 are not formed.

Figure 3B:
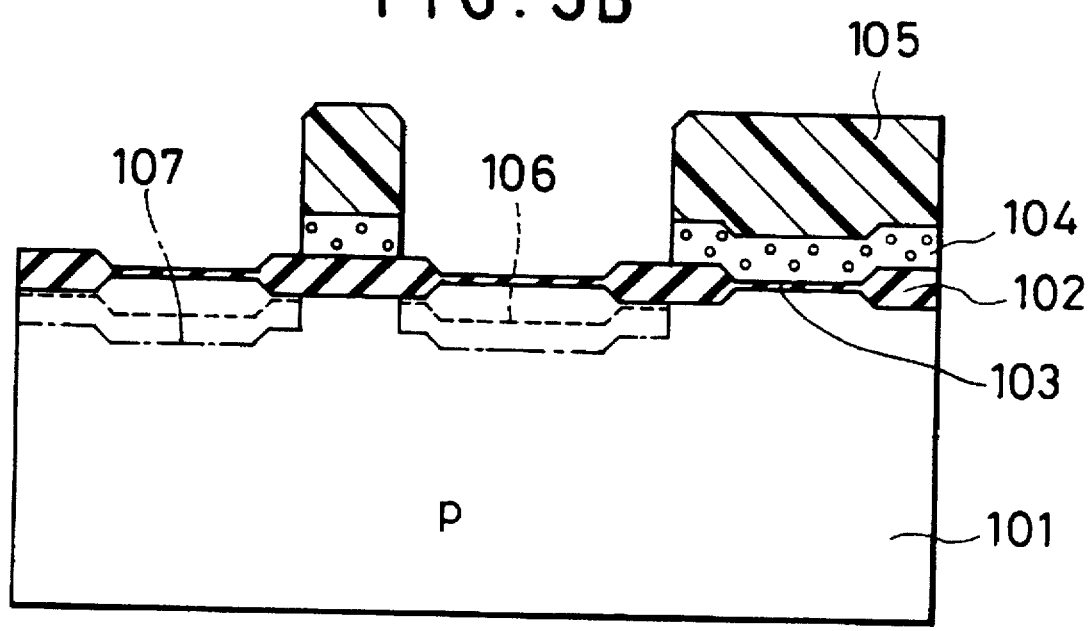

Then, with reference to FIG. 3B, a poly crystalline silicon layer 104 which is to act as a mask and have a thickness of 800 nm are formed by means of LPCVD (low-pressure chemical vapor deposition) process. After a photoresist layer 105 having a thickness of 3 μm has been applied on the poly crystalline silicon layer 104, the photoresist layer 105 is removed only at regions where p-well layers are to be formed. Then, the poly crystalline silicon layer 104 are patterned by reactive ion etching using the photoresist layer 105 as a mask to thereby have the same pattern as the photoresist layer 105. Then, there is formed first ion implantation layers 106 by implanting boron by the number of $4\times10^{12}$ per square centimeter at an energy of 140 KeV, and furthermore second ion implantation layers 107 by implanting boron by the number of $5\times10^{13}$ per square centimeter at an energy of 400 KeV with the stacked layers 104 and 105 acting as a mask.

The first ion implantation layer 106 is formed for forming a channel stopper in a p-well layer to be formed below the field oxidation layer 102, and also for forming a layer in a p-well layer in active regions, which layer is for preventing punch-through between a source and a drain of a transistor. The second ion implantation layer 107 is formed for forming a main body of a p-well layer.

Figure 4A:
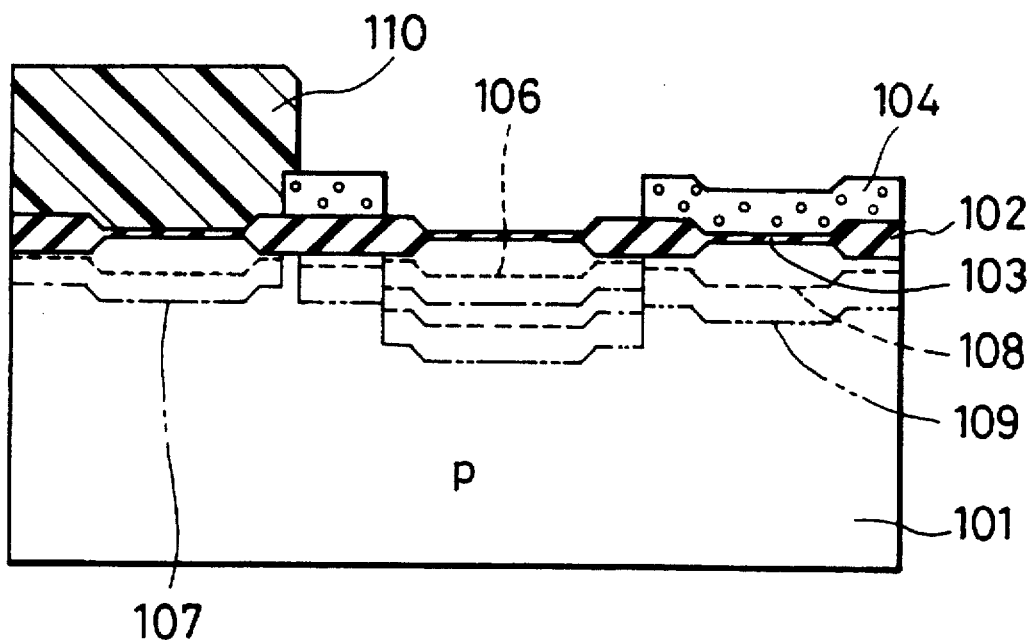

Referring to FIG. 4A, after the photoresist layers 105 have been removed, there is applied a photoresist layer 310 having a thickness of 4 μm with the poly crystalline silicon layer 104 acting as a mask remaining as they are. Thus, a region where a n-well layer 112 and an buried n-well layer 113 are to be formed is exposed. Then, there is formed a third ion implantation layer 108 by implanting phosphorus by the number of $5\times10^{12}$ per square centimeter at an energy of 1.2 MeV, and subsequently there is formed a fourth ion implantation layer 109 by implanting phosphorus by the number of $3\times10^{13}$ per square centimeter at an energy of 2 MeV.

In the formation of the third and fourth ion implantation layers 108 and 109, phosphorus does not reach the p-type silicon substrate 101 in a region where the photoresist layer 110 is still existent. Under a region where the poly crystalline silicon layers or mask 104 are still existent on the field oxide layers 102, there is a peak of the concentration of the third ion implantation layers 108 just below the field oxide layers 102, and there also is a peak of the concentration of the fourth ion implantation layers 109 at a depth of approximately 0.9 μm from a surface of the p-type silicon substrate 101. In a region where the photoresist layers 110 and the poly crystalline silicon layers 104 are no longer existent, namely the field oxide layers 102 are exposed outside, a peak of the concentration of the third ion implantation 108 is located at a depth of approximately 1.2 μm from a surface of the p-type silicon substrate 101, and a peak of the concentration of the fourth ion implantation 109 is located at a depth of approximately 1.8 μm from a surface of the p-type silicon substrate 101.

Figure 4B:
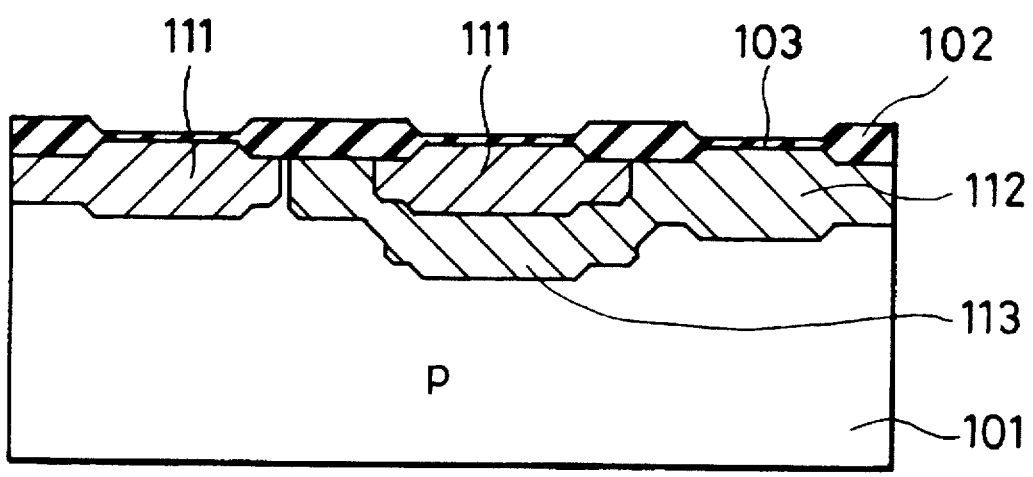

Referring to FIG. 4B, after the photoresist layers 110 have been removed, the poly crystalline silicon layers 104 acting as a mask are also removed. Then, the substrate 101 is thermally treated at a temperature of 950 degrees centigrade for 30 minutes, to thereby electrically activate implanted impurities. Thus, there are formed retrograde-distributed p-well layers 111, n-well layers 112 and buried n-well layers 113.

The third ion implantation layers 108, in a region below the field oxide layers 102, act as a channel stopper having a concentration peak just below the field oxide layers 102, and in active regions where poly crystalline silicon layers 104 are formed, act as a punch-through preventing layer for preventing punch-through between a source and a drain of a transistor. The fourth ion implantation layers 109, which have a concentration peak at a depth of 0.9 μm in a region where the poly crystalline silicon layer or mask 104 are still existent on the field oxide layers 102, becomes a main part of the n-well layers 112 in the active regions where the poly crystalline silicon layers 104 are still existent. In the active regions where both the poly crystalline silicon layers 104 and the photoresist layers 110 are still existent, namely the field oxide layers 102 are exposed, the third ion implantation layers 108 having a concentration peak located deeper than 1 μm from a surface of the substrate 101, and the fourth ion implantation layers 109 become the buried n-well layers 113.

As having been explained, the embodiment makes it possible to fabricate a semiconductor device having a retrograde-distributed triple well structure with two photolithography steps and four ion implantation steps. Thus, the embodiment provides an advantage that masks and steps necessary for forming a retrograde-distributed triple well structure can be reduced. Specifically, the number of masks can be reduced from three (conventional method) to two (the invention), and the steps can be reduced from five (conventional method) to four (the invention).

[Embodiment 2]

Hereinbelow will be explained a second embodiment in accordance with the invention with reference to FIGS. 5A, 5B, 6A and 6B.

Figure 5A:
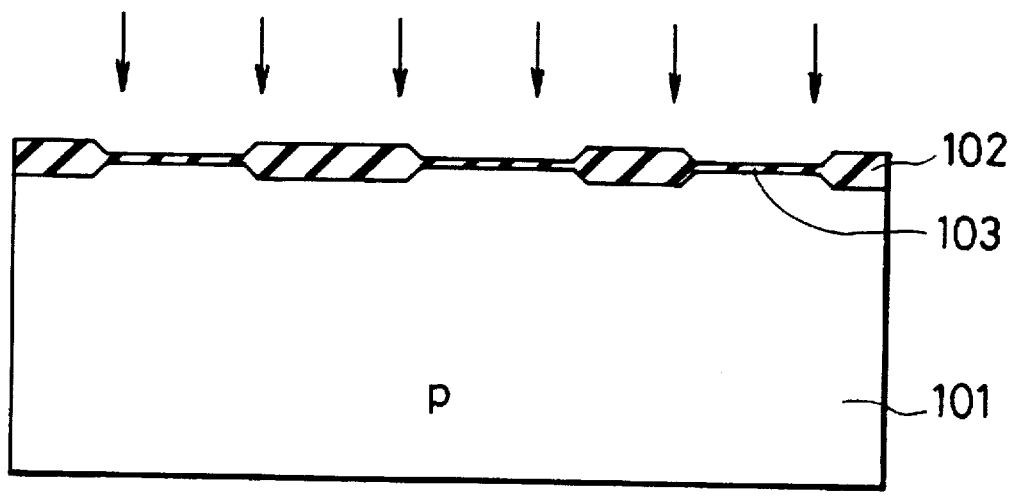
FIGS. 5A, 5B, 6A and 6B are cross-sectional views showing the steps of a method in accordance with a second embodiment of the present invention.

Referring to FIG. 5A, first, there is formed field oxide layers 102 having a thickness of 400 nm by means of LOCOS process on one of main surfaces of a p-type silicon substrate 101. There is also formed silicon dioxide layers 103 having a thickness of 50 nm by means of thermal oxidation process on a region in which the field oxide layers 102 are not formed. Then, a determined amount of boron is ion-implanted at an energy of 30 KeV.

Figure 5B:
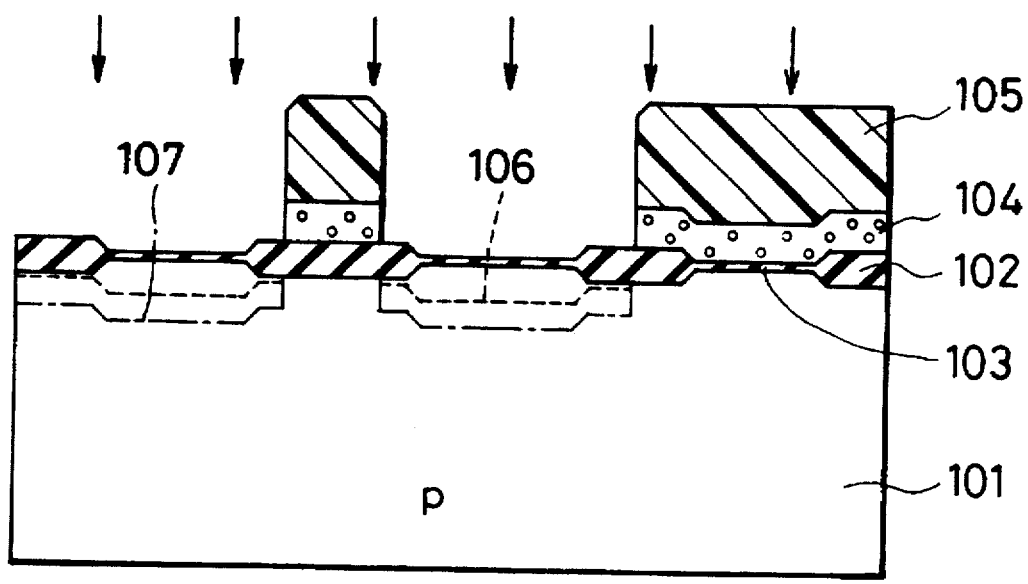

Then, with reference to FIG. 5B, a poly crystalline silicon layer 104 which is to act as a mask and have a thickness of 800 nm are formed by means of LPCVD (low-pressure chemical vapor deposition) process. After a photoresist layer 105 having a thickness of 3 μm has been applied on the poly crystalline silicon layer 104, the photoresist layer 105 is removed only at regions where p-well layers are to be formed. Then, the poly crystalline silicon layer 104 are patterned by reactive ion etching using the photoresist layer 105 as a mask to thereby have the same pattern as the photoresist layer 105. Then, there is formed first ion implantation layers 106 by implanting boron by the number of $4\times10^{12}/cm^2$ at an energy of 140 KeV, and furthermore second ion implantation layers 107 by implanting boron by the number of $5\times10^{13}/cm^2$ at an energy of 400 KeV with the stacked layers 104 and 105 acting as a mask. Then, a determined amount of boron is ion-implanted at an energy of 30 KeV.

Figure 6A:
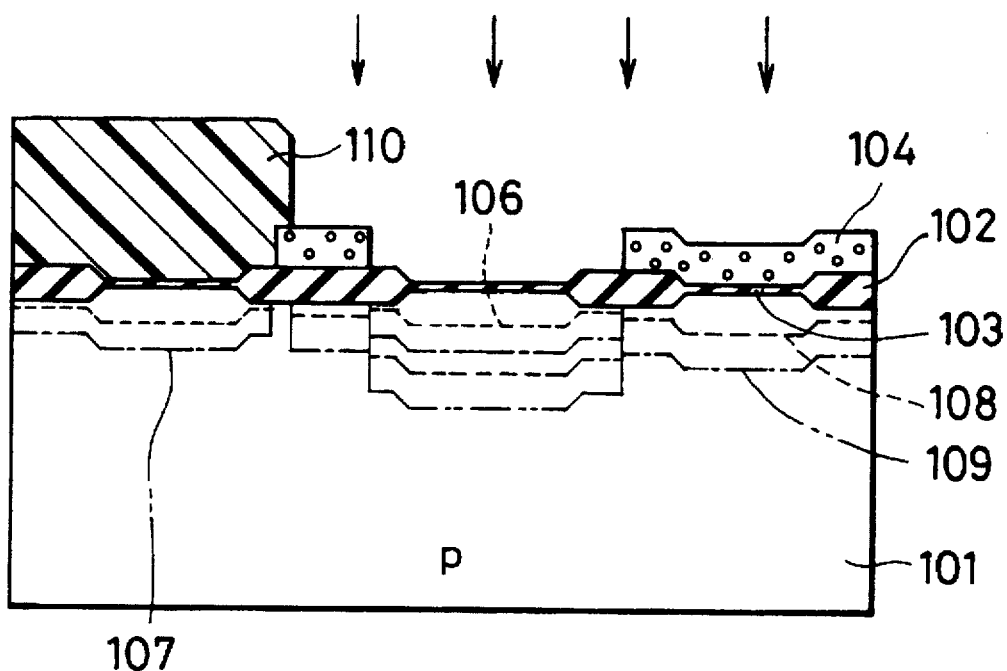

Referring to FIG. 6A, after the photoresist layers 105 have been removed, there is applied a photoresist layer 110 having a thickness of 4 μm with the poly crystalline silicon layer 104 acting as a mask remaining as they are. Thus, a region where a n-well layer 112 and a buried n-well layer 113 are to be formed is exposed. Then, there is formed a third ion implantation layer 108 by implanting phosphorus by the number of $5\times10^{12}$ per square centimeter at an energy of 1.2 MeV, and subsequently there is formed a fourth ion implantation layer 109 by implanting phosphorus by the number of $3\times10^{13}$ per square centimeter at an energy of 2 MeV. Then, a determined amount of boron is ion-implanted at an energy of 30 KeV.

Figure 6B:
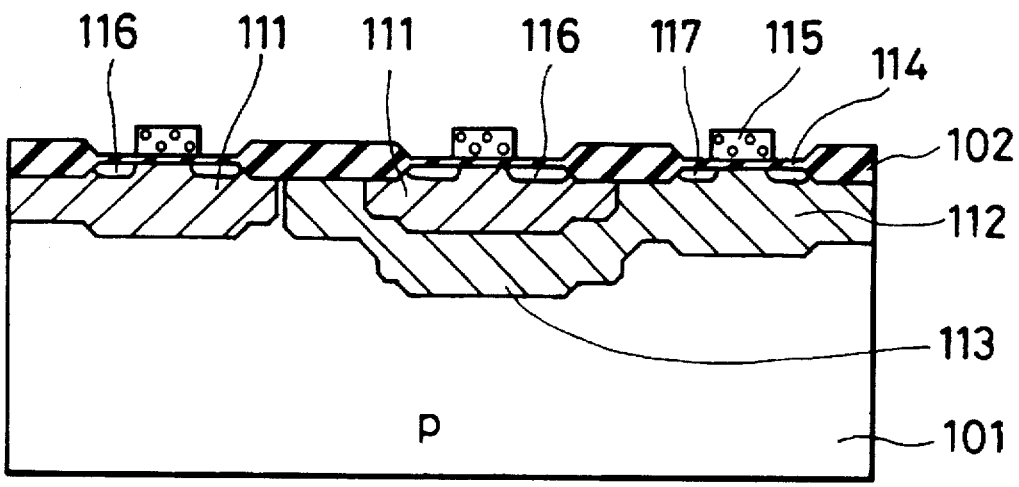

Referring to FIG. 6B, after the photoresist layers 110 have been removed, the poly crystalline silicon layers 104 acting as a mask are also removed. Then, the substrate 101 is thermally treated at a temperature of 950 degrees centigrade for 30 minutes, to thereby electrically activate implanted impurities. Thus, there are formed retrograde-distributed p-well layers 111, n-well layers 112 and buried n-well layers 113.

After the silicon dioxide layers 103 have been removed, there are formed by means of a conventional method gate oxidation layers 114, gate electrodes 115, n+ type diffusion layers 116 and p+ type diffusion layers 117.

The second embodiment provides an advantage as well as that provided by the first embodiment, that it is possible by using a common mask to control a threshold voltage (Vth) of both a n-type surface channel transistor to be formed in the p-well layer 111 and a p-type buried channel transistor to be formed in the n-well layer 112.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

For instance, the mask layers may be composed of inorganic substances such as silicon nitride and organic substances such as polyimide in place of poly crystalline silicon. An energy for ion-implantation and dosage may be varied as required.

What is claimed is:

1. A method of fabricating a semiconductor device, comprising the steps of:
   forming a plurality of active regions on a semiconductor substrate;
   covering a first active region with mask layers including a first mask layer and a second mask layer deposited on said first mask layer;
   implanting first electrically conductive type impurities into second and third active regions with said mask layers acting as a mask;
   removing said second mask layer;
   covering said third active regions with a third mask layer; and
   implanting second electrically conductive type impurities into said first and second active regions.

2. The method as recited in claim 1, wherein said plurality of active regions are formed by oxidizing said semiconductor substrate at selected regions.

3. The method as recited in claim 1, wherein said semiconductor substrate is of a first electrically conductive type.

4. The method as recited in claim 1, wherein said first mask layer is composed of poly crystalline silicon and said second mask layer is composed of photoresist.

5. The method as recited in claim 1, wherein said step of implanting first electrically conductive type impurities and said step of implanting second electrically conductive type impurities are achieved by a plurality of ion-implantations having different ranges.

6. The method as recited in claim 1 further comprising the step of ion-implanting for adjusting a threshold voltage of a MOS type transistor, said step being carried out just before the step of covering said first active region with said mask layers.

7. The method as recited in claim 1 further comprising the step of ion-implanting for adjusting a threshold voltage of a MOS transistor, said step being carried out just before the step of implanting second electrically conductive type impurities into said first and second active regions.

8. The method as recited in claim 1 further comprising the step of covering a region located between said second and third active regions with the same mask layers as the mask layers with which said first active region is covered.

* * * * *